United States Patent [19]

Kato et al.

[11] Patent Number: 4,468,749

[45] Date of Patent: Aug. 28, 1984

[54] ADJUSTABLE ATTENUATOR CIRCUIT

[75] Inventors: Seiji Kato, Yamato; Norio Ueno, Kawasaki; Mitsuo Kakuishi, Yokohama, all of Japan

[73] Assignee: Fujitsu Limited, Kawasaki, Japan

[21] Appl. No.: 292,275

[22] Filed: Aug. 12, 1981

[30] Foreign Application Priority Data

Aug. 20, 1980 [JP] Japan ............................ 55-114478
Aug. 29, 1980 [JP] Japan ............................ 55-119218

[51] Int. Cl.³ .............................................. H03G 3/00
[52] U.S. Cl. ................................... 364/861; 364/571; 307/520
[58] Field of Search .................. 364/861, 480, 571; 329/104; 307/520-521, 540, 543, 556; 328/127

[56] References Cited

U.S. PATENT DOCUMENTS 4,354,250 10/1982 Lee ..................................... 364/861
4,393,351 7/1983 Gregorian ......................... 328/127

FOREIGN PATENT DOCUMENTS 2019151 10/1979 United Kingdom ................ 307/520

OTHER PUBLICATIONS

H. C. Pakangia et al., 2 Phase Circulating Shift Reg. for Switched-Capacitor N-Path Filters, May 27, 1982, p. 444.

IEEE International Solid-State Circuits Conference, "A Realtime Programmable Switched Capacitor Filter", by Cox et al., 1980, pp. 94-95 and 264.

Proc. ISCAS, "A CMOS Digitally Controlled Analog Attenuator for Voice-Band Signals," by Baldwin et al., 1977, pp. 519-524.

Electronics Letters, "Increasing the Clock Frequency of Switched-Capacitor Filters", by T. Viswanathan, vol. 16, No. 9, Apr. 1980, pp. 316-317.

ISCAS 1979, "Improved Circuits for the Realization of Switched Capacitor Filters", by Ken Martin, pp. 756-759.

Primary Examiner—Gareth D. Shaw
Assistant Examiner—Thomas Black
Attorney, Agent, or Firm—Staas & Halsey

[57] ABSTRACT

An adjustable attenuator circuit in which sampled electric charges are partially transferred from a sampling capacitor to a charge dividing capacitor during a short time within each sampling period, and electric charges stored in the charge dividing capacitor are additively transferred to an integrating capacitor or are discharged to ground according to the content of a weighting coefficient which determines the attenuation factor of the adjustable attenuator circuit.

10 Claims, 11 Drawing Figures

ADJUSTABLE ATTENUATOR CIRCUIT

BACKGROUND OF THE INVENTION

(1) Field of the Invention

The present invention relates to an adjustable attenuator circuit, more particularly to an adjustable attenuator circuit which comprises switched capacitors and which is used, for example, in an electronic circuit, such as a PCM coder or decoder.

(2) Description of the Prior Art

Figure 1:
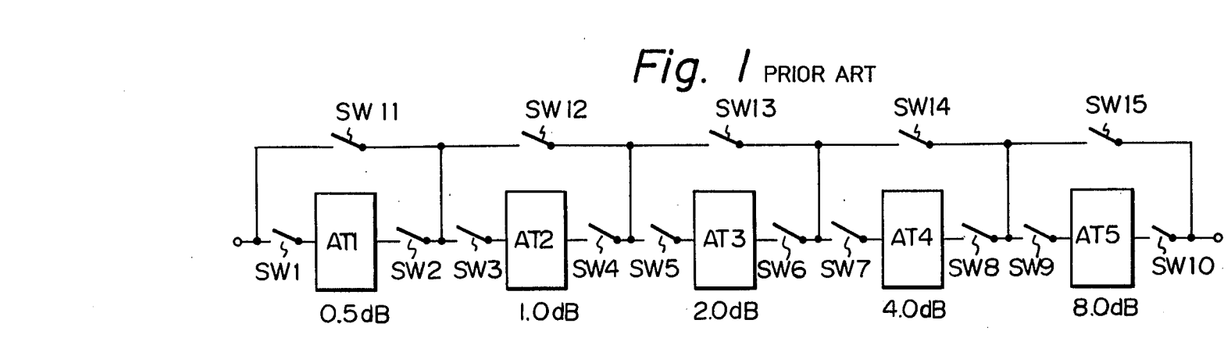
FIG. 1 is a block diagram illustrating a conventional adjustable attenuator circuit.

In a conventional adjustable attenuator circuit, the attenuation factor thereof is adjusted by inserting or bypassing each of the fixed attenuators having various attenuation factors. For example, as illustrated in FIG. 1, such an attenuator circuit comprises fixed attenuators AT1, AT2, AT3, AT4 and AT5 whose attenuation factors are 0.5 dB, 1.0 dB, 2.0 dB, 4.0 dB and 8.0 dB, respectively, and which are connected in cascade through electronic switches SW1 through SW10 and can be bypassed by each of the electronic switches SW11 through SW15. In the adjustable attenuator circuit of FIG. 1, it is possible to obtain the attenuation from 0 dB to 15.5 dB in a 0.5 dB step by the selective operation of the electronic switches SW1 through SW15.

However, in the above-mentioned conventional attenuator circuit, since the on-resistance and the off-resistance of each of the electronic switches affect the attenuation of the attenuator circuit, it is impossible to obtain a high precision attenuation factor. Especially when the adjustable attenuator circuit of FIG. 1 is formed in an integrated circuit, the error of the attenuation factor becomes large because the resistor characteristic of each of the electronic switches cannot be ideal due to the limitation of, for example, the space available to form the electronic switches.

Figure 2:
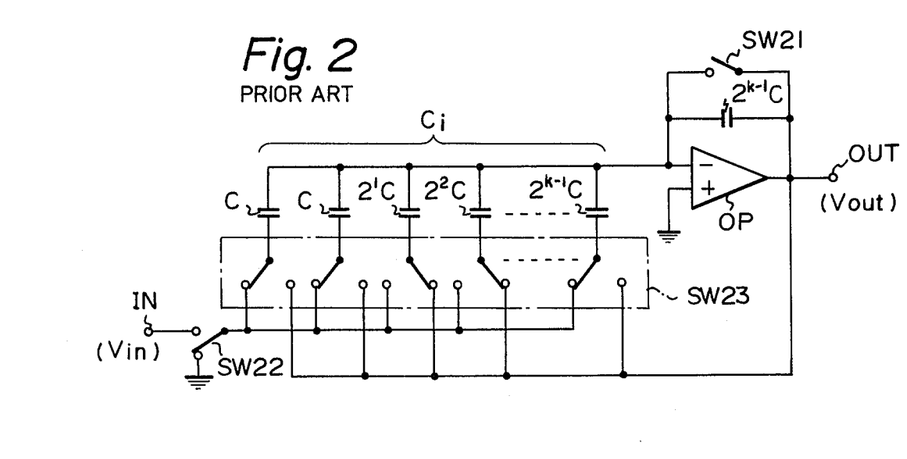
FIG. 2 is a circuit diagram illustrating another conventional adjustable attenuator circuit.

There is known another conventional adjustable attenuator in which the attenuation factor thereof is determined by the ratio of the capacitances of the capacitors and which is disclosed, for example, in the thesis by G. L. Baldwin et al, "A CMOS Digitally-Control Analog Attenuator for Voice Band Signals", Proc. ISCAS '77, pp. 519-524. The attenuator circuit disclosed in this thesis comprises, as illustrated in FIG. 2, input capacitors having capacitances of $C, C, 2C, 2^2C, \ldots, 2^{K-1}C$ respectively, a feedback capacitor having a capacitance of $2^{K-1}C$, a switch unit SW23 which comprises a plurality of switches, switches SW21 and SW22, and, an operational amplifier OP. The switches SW21 and SW22 are both operated at a sampling frequency higher than twice that of the highest frequency of an input signal $V_{in}$. The attenuation factor of the attenuator circuit of FIG. 2 is determined by the positions of the switches of the switch unit SW23. The relation between the input signal $V_{in}$ and the output signal $V_{out}$ becomes as follows.

$$V_{out}/V_{in} = NC/(C_T - NC) \quad (1)$$

Where, $N = 1, 2, 3, \ldots, 2^{K-1}$, $C_T = 2^K C$, $K+1$ is a number of the input capacitors $C_i$, and, NC is the total capacitance of the input capacitors which are connected between the switch SW22 and the inverting input terminal of the operational amplifier OP via the switches of the switch unit SW23. Therefore, $C_T - NC$ is equal to the total capacitance of the input capacitors, which are connected between the inverting input terminal and the output terminal OUT of the operational amplifier OP. Since the details of the attenuator circuit of FIG. 2 are disclosed in the above-mentioned thesis, the detailed explanation thereof is omitted here.

However, it should be noted that, in the above-mentioned conventional attenuator circuit, it is necessary to set K to approximately 9 in order to obtain 32 steps of attenuation with precision. Practically, speaking in this case, the number of the steps of attenuation can be $2^{9-1} = 256$, and 32 steps of the 256 steps are utilized. The ratio of the maximum capacitance to the minimum capacitance of the input capacitors becomes $2^8$ and if the maximum capacitance of an input capacitor is 32pF, the minimum capacitance of an input capacitor is 0.125pF. Therefore, it is very difficult to form the capacitors having a large capacitance ratio and including the capacitors of very small capacitances with high precision in an integrated circuit.

SUMMARY OF THE INVENTION

It is, therefore, the principal object of the present invention to provide a high precision adjustable attenuator circuit in which the number of the steps of the attenuation factor can be large without using a large number of capacitors.

It is another object of the present invention to provide a high precision adjustable attenuator circuit in which the aforementioned capacitance ratio can be small.

It is still another object of the present invention to provide a high precision adjustable attenuator circuit which is suitable for use in an integrated circuit.

It is still another object of the present invention to provide an adjustable switched capacitor filter which uses the above-mentioned adjustable attenuator circuits.

According to the present invention, there is provided an adjustable attenuator circuit comprising: one or more sampling capacitors connected to an input terminal through sampling switches which are operated for a short time during each sampling period; an operational amplifier having an inverting input terminal, a non-inverting input terminal and an output terminal; an integrating capacitor connected between the inverting input terminal and the output terminal of the operational amplifier; a feedback capacitor circuit connected between the inverting input terminal and the output terminal of the operational amplifier through one or more switches; one or more charge dividing capacitors to which the electric charges stored in the sampling capacitors are partially transferred numerous times during each sampling period, the transfer period being shorter than the sampling period; a weighting coefficient generator circuit which stores a weighting coefficient and generates switching pulses in accordance with the weighting coefficient; and one or more switch means which operate so as to additively transfer the electric charges stored in the charge dividing capacitors to the integrating capacitor or to discharge the electric charges stored in the charge dividing capacitors in accordance with the switching pulses from the weighting coefficient generator circuit.

DESCRIPTION OF THE PREFERRED EMBODIMENTS

Figure 3:
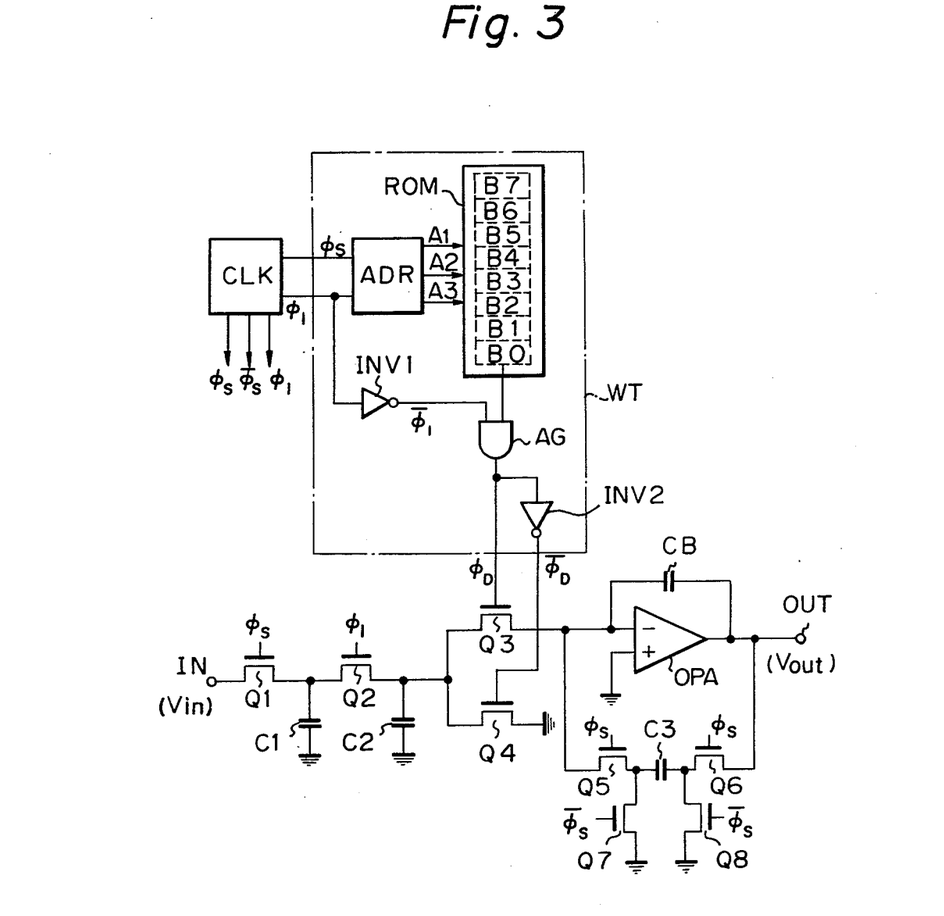
FIG. 3 is a circuit diagram illustrating a first embodiment of an adjustable attenuator circuit in accordance with the present invention.

As illustrated in FIG. 3, an adjustable attenuator circuit according to the present invention comprises transistor switches Q1 through Q8 constituted by MOS field effect transistors, an operational amplifier OPA, a weighting coefficient generator WT, a clock generator CLK, a sampling capacitor C1, a charge dividing capacitor C2, an integrating capacitor CB, and a feedback capacitor C3. The weighting coefficient generator WT comprises an address generator ADR, a read only memory ROM, an AND gate AG and inverters INV1 and INV2.

In the adjustable attenuator circuit of FIG. 3, the clock generator CLK generates sampling pulses $\phi_S$ and $\bar{\phi}_S$ and a switching pulse $\phi_1$ having a period $T_1$ which is 1/n of a period $T_s$ of the sampling pulse $\phi_S$. The switching pulse $\phi_1$ is applied to the transistor switch Q2 which transfers a part of the electric charge from the capacitor C1 to the capacitor C2. In the weighting coefficient generator WT, the address generator ADR counts the switching pulse $\phi_1$ and generates, for example, three bit address signals A1, A2 and A3 which change sequentially, for example, from (0, 0, 0) to (1, 1, 1). The read only memory ROM memorizes the weighting coefficient consisting, for example, of eight bit data B0, B1, B2, ..., B7 which are sequentially read out as data pulses $\phi_D$ and $\bar{\phi}_D$ by the address signals A1, A2 and A3. The weighting coefficient determines the attenuation factor of the attenuator circuit of FIG. 3.

Figure 4:
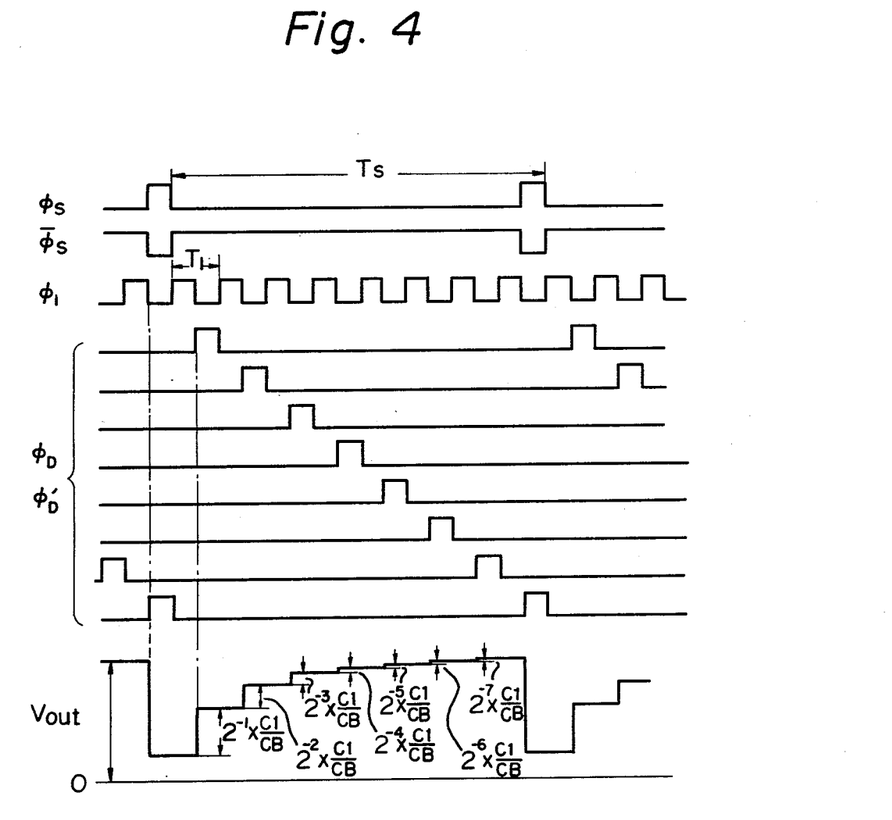
FIG. 4 is a waveform diagram for describing the operation of the adjustable attenuator circuit of FIG. 3.

With reference to FIG. 4, the operation of the attenuator circuit of FIG. 3 will now be explained in detal. Assume that n=8 and that the capacitances of the capacitors C1 and C2 are equal to each other. In this condition, an input signal applied to the input terminal IN is sampled to the capacitor C1 by the switching transistor Q1, which is controlled by the sampling pulse $\phi_S$ which becomes high during a first time slot of each sampling period $T_s$, so that the electric charges $q = V_{in} \cdot C1$ are stored in the capacitor C1. Then, the switching transistor Q2 is turned on by the first one of the switching pulse $\phi_1$ which becomes high during the second time slot of each sampling period $T_s$ and the capacitors C1 and C2 are connected parallel to each other. In this condition, half of the electric charges stored in the capacitor C1 are transferred to the capacitor C2, so that the electric charges (½)q are stored in the capacitor C2. If the eight bit data B0, B1, B2, ..., B7 of the weighting coefficient stored in the weighting coefficient generator WT are all "1", the data pulse $\bar{\phi}_D$ is always "0" but the data pulse $\phi_D$ becomes "1" each time after the electric charges in the capacitor C1 are divided with the capacitor C2. When the data pulse $\phi_D$ becomes "1", i.e., high, the switching transistor Q3 is turned on and a part of the electric charges in the capacitor C2, determined by the capacitance ratio C1/CB, is transferred to the integrating capacitor CB. Since the potential of the inverting input terminal of the operational amplifier OPA is zero, i.e., ground level, the remaining electric charges in the capacitor C2 are discharged to zero.

When the switching transistor Q2 is turned on by the next switching pulse $\phi_1$ and the capacitors C1 and C2 are connected parallel to each other, half of the electric charges stored in the capacitor C1, which are (¼)q, are transferred to the capacitor C2. Therefore, both the electric charges stored in the capacitors C1 and C2 become (¼)q. The switching transistor Q3 is then turned on by the data pulse $\phi_D$ and the predetermined rate, i.e. C1/CB, of the electric charges stored in the capacitor C2 is transferred to the integrating capacitor CB. Similarly, the electric charges in the capacitors C1 and C2 become (⅛)q, (1/16)q, ..., (1/256)q. That is, the electric charges in the capacitors C1 and C2 are reduced to half each time the switching transistor Q2 is turned on, and, the predetermined rate of the charges stored in the capacitor C2 are additively transferred to the integrating capacitor CB according to the weighting coefficient. Therefore, the output voltage $V_{out}$ at the output terminal OUT increases in a manner illustrated in FIG. 4. In this case, when the switching transistor Q3 is turned on by the eighth data pulse $\phi_D$, the switching transistors Q5 and Q6 are both turned on by the sampling pulse $\phi_S$ at the same time as the turn on of the switching transistor Q3. Therefore, the electric charges of (1/256)q from the capacitor C2 and the feedback charges through the feedback capacitor C3 are transferred to the integrating capacitor CB at the same time and the output potential $V_{out}$, determined by the difference between the electric charges (1/256)q and the feedback charges, is generated. The output signal $V_{out}$ is supplied to another circuit or device through a transfer gate which passes the output signal $V_{out}$ only for a short time after the eighth data pulse $\phi_D$ or $\bar{\phi}_D$ is applied to the switching transistor Q3 or Q4 and which is not shown in the drawing.

If the weighting coefficient (B0, B1, B2, ..., B7) is "00000010", only the seventh data pulse $\phi_D$ becomes "1", i.e., high and, at the other bits, the data pulses $\phi_D$ are all "0" and the data pulses $\bar{\phi}_D$ are all "1". Therefore, only the electric charges of (1/128)q are transferred to the integrating capacitor CB. When the data pulse $\bar{\phi}_D$ is "1", the electric charges in the capacitor C2 are discharged through the switching transistor Q4 to ground.

Figure 5:
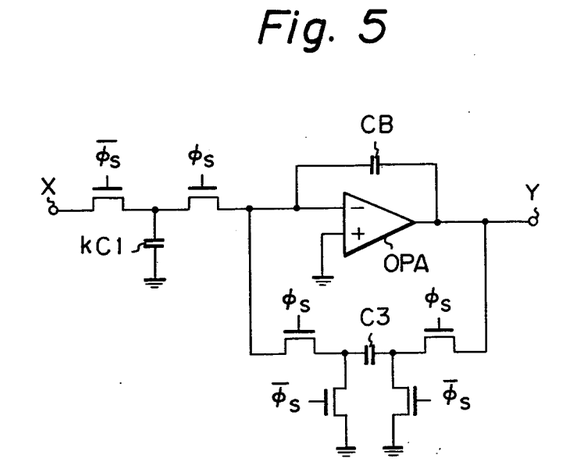
FIG. 5 is a circuit diagram illustrating an equivalent circuit of the adjustable attenuator circuit of FIG. 3.

FIG. 5 illustrates an equivalent circuit of the attenuator circuit of FIG. 3, and the relation between the input signal X and the output signal Y becomes as follows.

$$\frac{Y}{X} = -\frac{kC1}{C3} \cdot \frac{Z^{-1}}{1 + \frac{CB}{C3}(1 - Z^{-1})} \quad (2)$$

where, $Z^{-1}=e^{-j\omega T_s}$, $\omega$ is an angular frequency, and k is a coefficient which is determined by the combination of the numbers $2^{-1}, 2^{-2}, 2^{-3}, \ldots, 2^{-8}$ and which becomes one of 256 discrete values.

As is apparent from the above formula (2), the attenuation factor of the circuit of FIG. 3 is determined by kC1/C3 and it is possible to obtain 256 kinds of attenuation factors by using the eight bit weighting coefficient and by effecting the charge dividing operation eight times. The denominator of the formula (2) shows that the attenuation factor of the attenuator circuit of FIG. 3 has a frequency dependency. However, when the sampling frequency $f_s=1/T_s$ is amply larger than the input signal frequency, $Z^{-1}$ is nearly equal to 1 and, therefore, the frequency dependency can be neglected.

In the above-mentioned embodiment, the capacitance of the capacitor C1 is equal to that of the capacitor C2. However, it is also possible to set the capacitances of these capacitors C1 and C2 different from each other so that the weighting coefficient has a nonlinear characteristic. For example, if the capacitances of the capacitors C1 and C2 have the relation C1/C2=$\frac{1}{2}$, eight bits of the weighting coefficient have the weightings of $\frac{2}{3}$, $(\frac{1}{3})\times\frac{2}{3}$, $(\frac{1}{3})^2\times\frac{2}{3}$, $(\frac{1}{3})^3\times\frac{2}{3}$, $(\frac{1}{3})^4\times\frac{2}{3}$, $(\frac{1}{3})^5\times\frac{2}{3}$, $(\frac{1}{3})^6\times\frac{2}{3}$, $(\frac{1}{3})^7\times\frac{2}{3}$, respectively, and the attenuation of such an attenuator circuit can be one of 256 values determined by combinations of these eight numbers. In this case, the minimum value of k becomes $(\frac{1}{3})^7\times\frac{2}{3}=0.000305$, which is equal to $(\frac{1}{2})^{11.6}$. This means that in such an attenuator circuit in which C1/C2=$\frac{1}{2}$, it is possible to obtain, by effecting the charge dividing operation eight times, the minimum value of k which corresponds to that obtained by effecting the charge dividing operation 11.6 times in the attenuator circuit in which C1=C2. Therefore, in this case it is possible to obtain a very large attenuation factor and to speed up the operation of the attenuator circuit.

Figure 6:
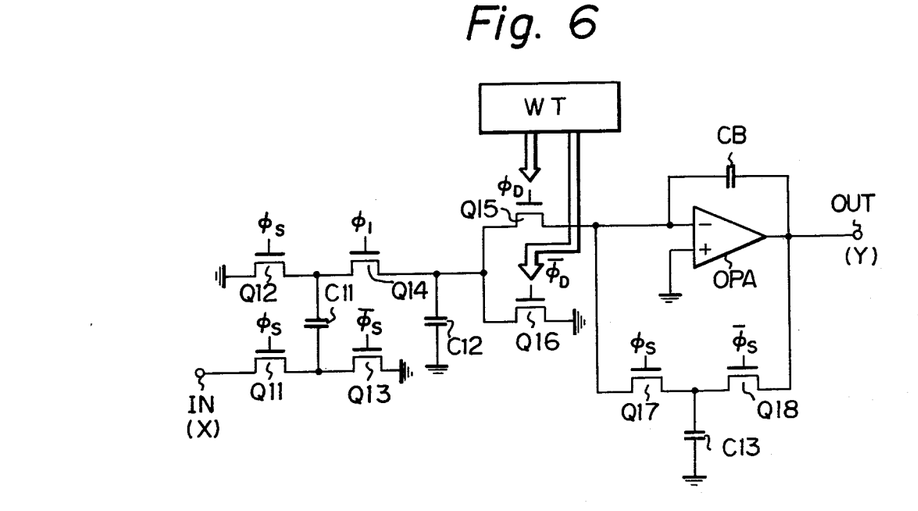
FIG. 6 is a circuit diagram illustrating a second embodiment of an adjustable attenuator circuit in accordance with the present invention.

FIG. 6 illustrates another embodiment of an attenuator circuit of the present invention. The attenuator circuit of FIG. 6 comprises capacitors C11, C12 and C13, MOS switching transistors Q11 through Q17. The other parts are the same as those in the embodiment of FIG. 3 and the same reference symbols are used. The sampling pulses $\phi_S$ and $\overline{\phi}_S$, the switching pulse $\phi_1$ and the data pulses $\phi_D$ and $\overline{\phi}_D$ are also the same as those in FIG. 3 and FIG. 4. In the attenuator circuit of FIG. 6, the structure of the switching circuit connected to the feedback capacitor C13 is simpler than that of the switching circuit connected to the feedback capacitor C3 of FIG. 3. In the charge dividing operation, the electric charges stored in the sampling capacitor C11 through the switching transistors Q11 and Q12 are partially transferred to the capacitor C12, in a reverse polarity, by the switching transistors Q13 and Q14.

In the attenuator circuit of FIG. 6, the relation between the input signal X applied to the input terminal IN and the output signal Y appearing at the output terminal OUT becomes as follows:

$$\frac{Y}{X} = \frac{kC11}{C13} \cdot \frac{1}{1+\frac{CB}{C13}(Z-1)} \quad (3)$$

where, k is one of the discrete values determined by the weighting coefficient as that of the formula (2). As is apparent from the formula (3), when the capacitance of the capacitor CB is equal to that of the capacitor C13, i.e., CB/C13=1, the denominator of the second term on the right side is equal to $Z(=e^{j\omega T_s})$ which does not influence the magnitude of the attenuation but only gives a phase shift thereto. Therefore, the attenuation factor of the attenuator circuit of FIG. 6 does not depend on the frequency of the input signal like that of the attenuator circuit constituted by pure resistance elements.

As is apparent from the above explanation, in the attenuator circuit according to the present invention, the weighting coefficient, which determines the attenuation factors, is set as a binary number of, for example, eight bits. The electric charges in the samping capacitor (C1 or C11) are partially transferred to the charge dividing capacitor (C2 or C12) for every time period $T_1$ which is shorter than the sampling period $T_S$. According to the content of each bit of the weighting coefficient, the electric charges stored in the charge dividing capacitor are transferred to the integrating capacitor CB or discharged to the ground through the switching transistors (Q3, Q15 or Q4, Q16). Therefore, it is not necessary to use a large number of capacitors, but it is only necessary to increase the number of times the charge dividing operation is carried out in order to obtain a large number of attenuation factors, so that the attenuator circuit according to the present invention is quite suitable for use in an integrated circuit.

When the capacitance of the sampling capacitor is different from that of the charge dividing capacitor, the weighting coefficient can be nonlinear and, therefore, it is possible to make the step of the attenuation factor large in a range where the attenuation factor is relatively small and small in a range where the attenuation factor is relatively large.

It is also possible to use a plurality of sets of the sampling capacitor and the charge dividing capacitor in order to obtain a large number of attenuation factors by effecting the charge dividing operation only a few times. For example, in the attenuator circuit of FIG. 3, if another sampling capacitor C1' and another charge dividing capacitor C2', having the relation C1'=C2'=C1/$2^4$, are added to the sampling capacitor C1 and the charge dividing capacitor C2, having the relation C1=C2, two different quantities of divided electric charges are obtained by effecting the charge dividing operation only one time and eight different quantities of electric charges, which are obtained by effecting the charge dividing operation eight times in the aforementioned embodiment, are obtained by effecting the charge dividing operation four times. In this case, the switching transistors, corresponding to Q3 and Q4 of FIG. 3, are provided for every pair of capacitors constituted by the sampling capacitor and the charge dividing capacitor.

The above-mentioned attenuator circuit can be adapted to a programnable switched capacitor filter whose frequency characteristics can be changed.

According to a recent development in MOS LSI technology, a switched capacitor filter, comprising switches, capacitors and operational amplifiers, can be formed in an integrated circuit. Moreover, the filter characteristics of the switched capacitor filter are determined not only by the capacitance value of each capacitor, but by the capacitance ratio of the capacitors, so that the filter characteristics are not affected by a change in the ambient temperature. Therefore, the switched capacitor filter has many applications.

Figure 7:
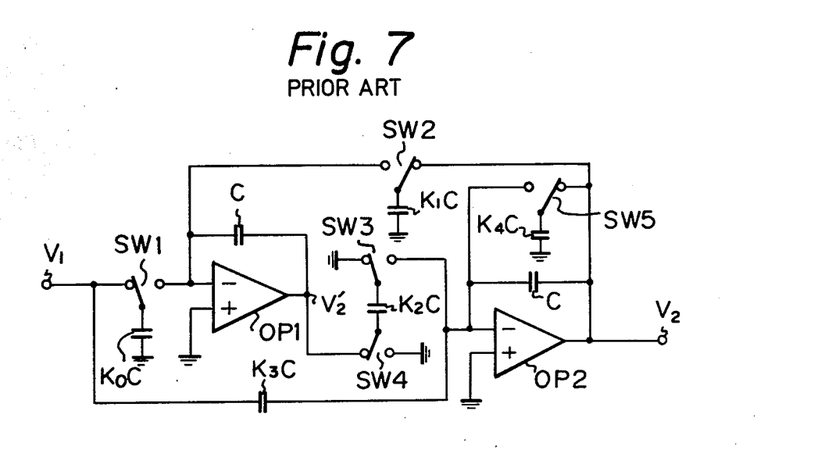
FIG. 7 is a circuit diagram illustrating a conventional switched capacitor filter circuit.

FIG. 7 is a circuit diagram illustrating the primary part of a conventional switched capacitor filter which is an example of a Biquad circuit. In FIG. 7, SW1 through SW5 designate switches constituted, for example, by transistors, C and $K_0C$ through $K_4C$ designate capacitors, and OP1 and OP2 designate operational amplifiers.

Figure 8:
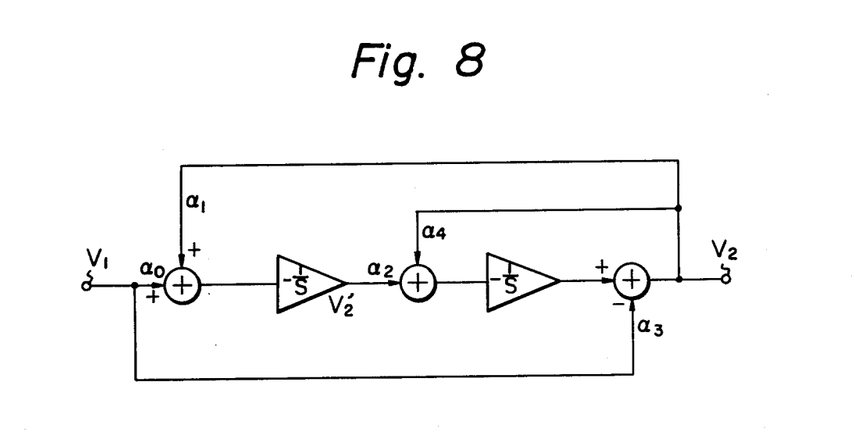
FIG. 8 is a circuit diagram illustrating an equivalent circuit of the switched capacitor filter circuit of FIG. 7.

FIG. 8 illustrates an equivalent circuit for the switched capacitor filter of FIG. 7. Assume that the sampling period is T. In this condition, each coefficient has the relation that $\alpha_0=K_0/T$, $\alpha_1=K_1/T$, $\alpha_2=K_2/T$, $\alpha_3=K_3$, and, $\alpha_4=K_4/T$. In FIG. 8, $-1/S$ shows a switched capacitor integration function by an approximation using an analog integration function. The relation between an input voltage $V_1$ and an output voltage $V_2$ becomes as follows.

$$V_2' = \alpha_0(-1/S)V_1 + \alpha_1(-1/S)V_2 \tag{4}$$

$$V_2 = -\alpha_2(-1/S)V_2' + \alpha_4(-1/S)V_2 - \alpha_3 V_1 \tag{5}$$

By solving the formulas (4) and (5), $V_2/V_1$ is obtained as follows.

$$\frac{V_2}{V_1} = \frac{-\alpha_3(S^2 + \alpha_0\alpha_2/\alpha_3)}{S^2 + \alpha_4 S + \alpha_1\alpha_2} \tag{6}$$

The formula (6) shows that the circuit of FIG. 7 has a second order filter characteristic, and, apparently, the filter characteristic can be changed by changing the capacitances of the capacitors in the circuit of FIG. 7.

There is proposed an adjustable switched capacitor filter comprising a number of capacitors, each of which determines the filter characteristic and which are selected in order to obtain a desired filter characteristic. Such an adjustable switched capacitor filter is disclosed in the thesis of Douglas B. Cox and Lyon T. Lin, "A Realtime Programmable Switched Capacitor Filter", 1980, IEEE ISSCC, PP. 94 through 95 and 264. However, such an adjustable switched capacitor filter necessitates a large number of capacitors when many kinds of filter characteristics are needed. Therefore, the capacitors occupy a very large area on a semiconductor chip, so that it is difficult to form such a filter in an integrated circuit.

There is proposed another adjustable switched capacitor filter comprising sets of capacitors and each set thereof has n capacitors having capacitances $2^{-1}$ Cm, $2^{-2}$ Cm, $2^{-3}$ Cm, ..., $2^{-n}$ Cm respectively. In this adjustable switched capacitor filter, it is possible to obtain $2^n$ filter characteristics by parallelly connecting the selected capacitors from the combinations of n capacitors. However, in this adjustable switched capacitor filter, the ratio of the maximum capacitance to the minimum capacitance becomes very large. Therefore it is very difficult to form capacitors having a large capacitance ratio and to include the capacitors of very small capacitances with high precision in an integrated circuit device.

The above-mentioned disadvantages in the conventional adjustable switched capacitor filter can be removed by adapting the attenuator circuit according to the present invention.

Figure 9:
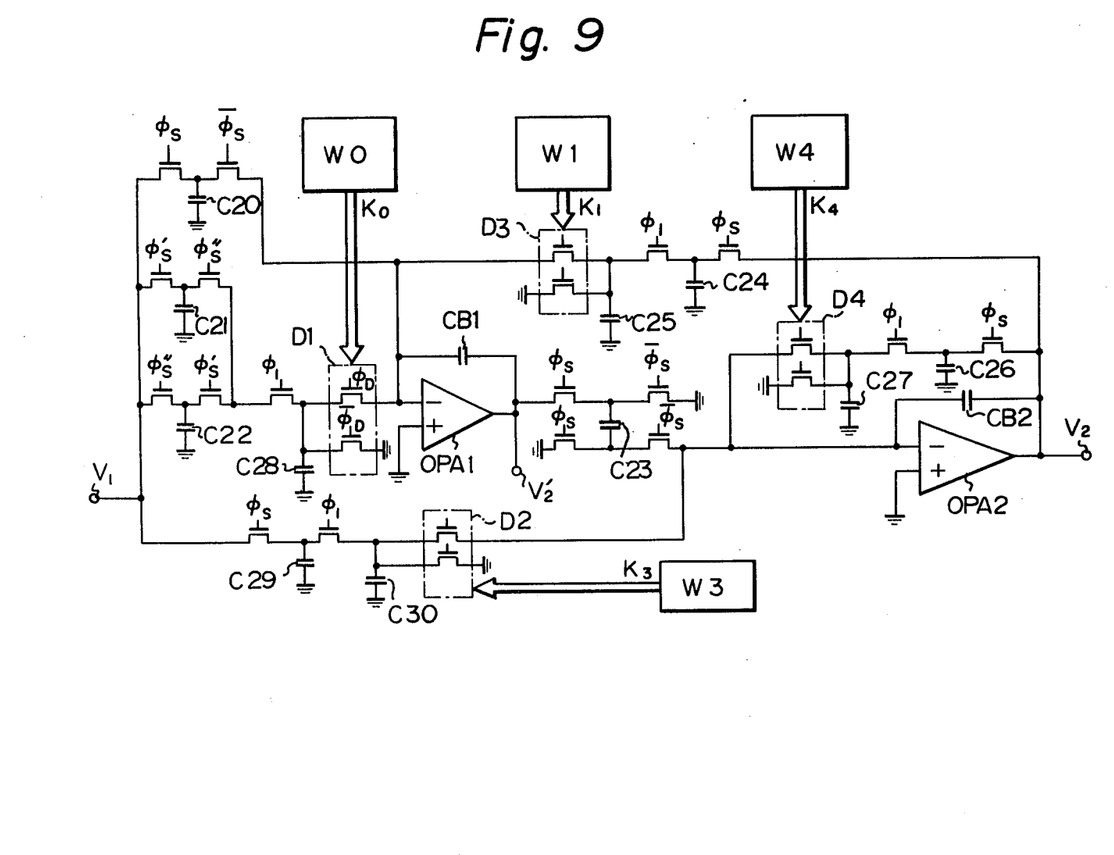
FIG. 9 is a circuit diagram illustrating a switched capacitor filter which uses the adjustable attenuator circuits according to the present invention.

FIG. 9 illustrates an adjustable switched capacitor filter in which the adjustable attenuator circuits according to the present invention are adapted to the Biquad circuit of FIG. 7 and the coefficients $K_0$, $K_1$, $K_3$ and $K_4$ can be changed by changing the weighting coefficients. In FIG. 9, W0, W1, W3 and W4 designate each weighting section in the weighting coefficient generator circuit WT' which will be described later in detail.

OPA1 and OPA2 are operational amplifiers, C20 through C30, CB1 and CB2 are capacitors, and, D1 through D4 are switches which are operated in accordance with the weighting coefficients.

Figure 10:
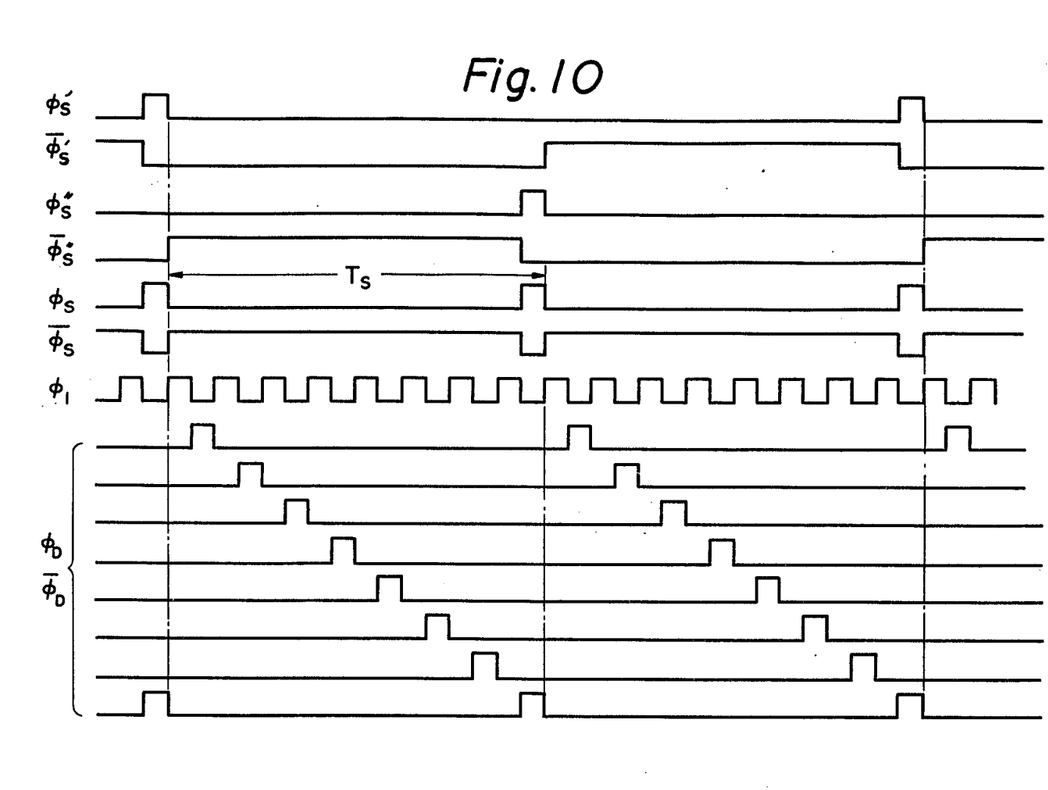
FIG. 10 is a waveform diagram illustrating the operation of the switched capacitor filter of FIG. 9.

FIG. 10 illustrates waveforms of pulses $\phi_S$, $\bar{\phi}_S$, $\bar{\phi}_S'$, $\phi_S''$, $\bar{\phi}_S''$, $\phi_1$, $\phi_D$ and $\phi_D'$ which are used for operating switches in the adjustable switched capacitor filter of FIG. 9. The waveforms of FIG. 10 are illustrated in a condition where each of the weighting coefficients from the weighting sections W0, W1, W3 and W4 is constituted by eight bit data. The pulses $\phi_S'$ and $\phi_S''$ have the same time period, which is twice the sampling period $T_S$ of the sampling pulse $\phi_S$, and the phases of the pulses $\phi_S'$ and $\phi_S''$ are different from each other by a half period thereof. With regard to the pulses $\phi_D$ and $\phi_D'$, only the timing thereof are illustrated in a similar manner to FIG. 4. However, in practice, the level of each of the pulses $\phi_D$ and $\phi_D'$ becomes high or low according to the corresponding weighting coefficient.

In the adjustable switched capacitor filter of FIG. 9, the switched capacitor circuit comprising the capacitors C21 and C22 gives a time delay for one sampling period $T_S$ to the input signal $V_1$ in order to adjust the timing with the signal passing through the switched capacitor circuit containing the capacitors C29 and C30, which signal is delayed for one sampling period $T_S$ until it reaches the output terminal OUT. The switched capacitor circuit comprising the capacitor C20 is used for correcting the error of the filter function which is caused by the above-mentioned signal delay due to the switched capacitor circuit containing the capacitors C21 and C22.

The capacitors C25, C27, C28 and C30 are charge dividing capacitors to which the electric charges from the sampling capacitors are partially transferred at each time period $T_1$ whose length is 1/n of the sampling period $T_S$. The capacitors C21, C22 and C28 and a switch circuit D1 constitute a circuit corresponding to the switched capacitor circuit including the capacitor $K_0C$ of FIG. 7. The capacitors C24 and C25 and a switch circuit D3 constitute a circuit corresponding to the switched capacitor circuit including the capacitor $K_1C$ of FIG. 7. The capacitors C26 and C27 and a switch circuit D4 constitute a circuit corresponding to the switched capacitor circuit including the capacitor $K_4C$ of FIG. 7. The capacitors C29 and C30 and a switch circuit D2 constitute a circuit corresponding to the capacitor circuit $K_3C$ of FIG. 7.

In the weighting coefficient generator WT' having the weighting sections W0, W1, W3 and W4, the binary weighting coefficients $K_0$, $K_1$, $K_3$ and $K_4$ are memorized and, according to the weighting coefficients $K_0$, $K_1$, $K_3$ and $K_4$, the switch circuits D1, D3, D2 and D4 are respectively operated so as to transfer the electric charges stored in the charge dividing capacitors to the corresponding integrated capacitors or to discharge the electric charges in the charge dividing capacitors to ground. Therefore, it is possible to obtain the desired filter characteristics by setting the weighting coefficients in the weighting coefficient generator WT'.

Figure 11:
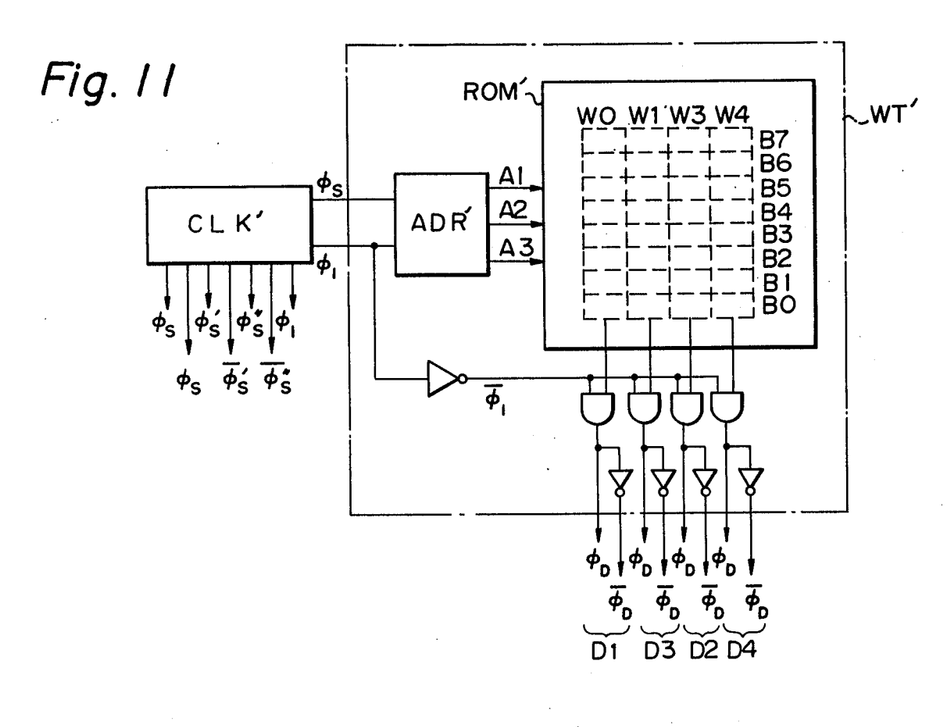
FIG. 11 is a circuit diagram illustrating a weighting circuit used in the switched capacitor filter circuit of FIG. 9.

As illustrated in FIG. 11, the weighting coefficient generator WT' comprises, for example, an address generator ADR' which is connected to a clock generator CLK' generating various operating pulses, a read only memory ROM' which stores weighting coefficients for the switching circuits D1, D2, D3 and D4, AND gates and inverters. The operation of the weighting coefficient generator WT' is substantially the same as that of the weighting coefficient generator WT of FIG. 3 and, therefore, an explanation thereof is omitted here.

In the above, the Biquad circuit is described. However, it should be noted that the adjustable attenuator circuit according to the present invention can be adapted to another switched capacitor filter having an other structure or to a switched capacitor filter of a higher order.

We claim:

1. An adjustable attenuator circuit operatively connectable to receive a sampling signal defining sampling periods having time slots, and having an input terminal operatively connectable to receive an input signal to be attenuated, comprising:
   a sampling switch operatively connectable to receive the sampling signal and the input signal, said sampling switch operated during the first time slot of each of the sampling periods;
   a sampling capacitor connected to the sampling switch;
   a charge dividing capacitor operatively connected to said sampling capacitor, the electric charges stored in said sampling capacitor being partially transferred during the second time slot of each of the sampling periods;
   an operational amplifier having an inverting input terminal, a non-inverting input terminal and an output terminal;
   an integrating capacitor connected between the inverting input terminal and the output terminal of said operational amplifier;
   a feedback capacitor circuit connected between the inverting input terminal and the output terminal of said operational amplifier;
   means for storing a weighting coefficient and for generating switching pulses in accordance with said weighting coefficient; and
   switch means for transferring the electric charges stored in said charge dividing capacitor to said integrating capacitor or to discharge said electric charges stored in said charge dividing capacitor in dependence upon said switching pulses from said storing and generating means, said electric charges accumulating on said integrating capacitor, the amount of accumulated charges corresponding to the weighting coefficient.

2. An adjustable attenuator circuit as set forth in claim 1, wherein said weighting coefficient is a binary number having a plurality of bits.

3. An adjustable attenuator circuit as set forth in claim 2, wherein said weighting coefficient generator circuit comprises:
   a memory device for storing said binary number; and
   an address generator circuit, operatively connected to said memory device, for generating address signals for said memory device in order to sequentially read out each bit of said binary number during consecutive time periods each of which is shorter than said sampling period, said switching pulses being generated sequentially in accordance with said each bit read out from said memory device.

4. An adjustable attenuator circuit as set forth in claim 3, wherein said memory device is a read only memory device.

5. An adjustable attenuator circuit as set forth in claim 1, 2, 3 or 4, wherein the electric charges stored in said sampling capacitor are partially transferred to said charge dividing capacitor in reverse polarity.

6. An adjustable attenuator circuit as set forth in claim 1, 2, 3 or 4, wherein said feedback capacitor circuit comprises:
   a feedback capacitor having first and second terminals;
   a first switching transistor connected between said inverting input terminal of said operational amplifier and said first terminal of said feedback capacitor;
   a second switching transistor connected between said second terminal of said feedback capacitor and said output terminal of said operational amplifier;
   a third switching transistor connected between said first terminal of said feedback capacitor and ground; and
   a fourth switching transistor connected between said second terminal of said feedback capacitor and ground, said first and second switching transistors being turned on at the same time as the turn on of said sampling switch, and said third and fourth switching transistors being turned off during the turning-on time of said first and second switching transistors.

7. An adjustable attenuator circuit as set forth in claim 1, 2, 3 or 4, wherein said feedback capacitor circuit comprises:
   a feedback capacitor having first and second terminals;
   a first switching transistor connected between said inverting input terminal of said operational amplifier and said first terminal of said feedback capacitor; and
   a second switching transistor connected between said output terminal of said operational amplifier and said first terminal of said feedback capacitor, said second terminal of said feedback capacitor being connected to ground, said first switching transistor being turned on at the same time as the turn on of said sampling switch, and said second switching transistor being turned off during the turning-on time of said first switching transistor.

8. An adjustable attenuator circuit as set forth in claim 1, 2, 3 or 4, wherein each of said switch means comprises:
   a first switching transistor connected between a terminal of said charge dividing capacitor and said inverting input terminal of said operational amplifier; and
   a second switching transistor connected between said terminal of said charge dividing capacitor and ground, said first and second switching transistors being operated by said switching pulses having opposite polarity.

9. A switched capacitor filter having one or more adjustable attenuator circuits each of which is operatively connectable to receive a sampling signal defining periods and each of which has an input terminal operatively connectable to receive an input signal to be attenuated, each of said one or more adjustable attenuator circuits comprising:
   at least one sampling switch operatively connectable to receive the sampling signal and the input signal, said at least one sampling switch operated during a part of each of the sampling periods;
   at least one sampling capacitor connected to said at least one sampling switch;

an operational amplifier having an inverting input terminal, a non-inverting input terminal and an output terminal;

an integrating capacitor connected between the inverting input terminal and the output terminal of said operational amplifier;

at least one charge dividing capacitor operatively connected to at least one said sampling capacitor, the electric charges stored in said at least one sampling capacitor being partially transferred a plurality of times during each of the sampling periods, the transfer period being shorter than one of said sampling periods;

means for storing a weighting coefficient and for generating switching pulses in accordance with said weighting coefficient; and at least one switch means for transferring the electric charges stored in said at least one charge dividing capacitor to said at least one integrating capacitor or to discharge said electric charges stored in said at least one charge dividing capacitor in dependence upon said switching pulses from said storing and generating means, said integrating capacitor accumulating an amount of charges corresponding to the weighting coefficient.

10. A switched capacitor filter as set forth in claim 9, wherein said switched capacitor filter is a Biquad circuit.

* * * * *

UNITED STATES PATENT AND TRADEMARK OFFICE
CERTIFICATE OF CORRECTION

PATENT NO. : 4,468,749

DATED : AUGUST 28, 1984

INVENTOR(S) : SEIJI KATO ET AL.

It is certified that error appears in the above-identified patent and that said Letters Patent is hereby corrected as shown below:

Col. 3, line 12, "FIG. 8" should start a new paragraph;

line 39, "$\phi_S$" should be --$\phi_S$--;

line 55, "detal" should be --detail--.

Col. 9, line 52, "weighting coefficient generator" should be --storing and generating means--;

line 53, delete "circuit".

Signed and Sealed this

Ninth Day of April 1985

[SEAL]

Attest:

DONALD J. QUIGG

Attesting Officer     Acting Commissioner of Patents and Trademarks